Aug. 12, 1958 M. B. FINKELSTEIN 2,847,569

RELAXATION OSCILLATOR CIRCUIT

Filed March 30, 1955

INVENTOR.
Morris B. Finkelstein
BY H. W. Newton
ATTORNEY.

United States Patent Office 2,847,569

Patented Aug. 12, 1958

2,847,569

RELAXATION OSCILLATOR CIRCUIT

Morris B. Finkelstein, Collingswood, N. J., assignor to Radio Corporation of America, a corporation of Delaware Application March 30, 1955, Serial No. 497,829

10 Claims. (Cl. 250—36)

This invention relates in general to oscillator circuits and in particular to relaxation oscillator or pulse generator circuits which utilize a semi-conductor device such as a transistor as the active signal translating element.

One specific type of oscillator circuit which may employ transistors is the relaxation oscillator. Relaxation oscillator circuits generate non-sinusoidal waves such as voltage pulses by gradually storing and quickly releasing energy either in the electric field of a capacitor or in the magnetic field of an inductor. Such circuits are useful, for example, for electronic computer applications, as frequency dividers or as sawtooth wave generators which can be used in the deflection circuits of television receivers. Generally, one or more time constant networks are needed in such circuits and the magnitudes of the voltage and current waveforms generated may be limited in amplitude.

It is an object of the present invention to provide an improved pulse generator or relaxation oscillator circuit utilizing semi-conductor devices which is simple in construction and utilizes a minimum number of circuit components.

It is a further object of the present invention to provide an improved transistor relaxation oscillator circuit or pulse generator in which low frequency square waves may be generated at a relatively low impedance level.

It is yet another object of the present invention to provide an improved transistor pulse generator for generating voltage and current waves of relatively large magnitude.

These and further objects and advantages of the present invention are achieved, in general, by a circuit arrangement utilizing a junction transistor connected for common or grounded emitter operation. Feedback is provided by a transformer, the primary of which is connected in series with the output or collector electrode and the secondary of which is connected in series with the base or input electrode. Regenerative collector-to-base feedback is thus provided and sustained oscillation is achieved to provide useful current and voltage waveforms at the collector, emitter and base electrodes of the transistor. Thus a relaxation oscillator circuit in accordance with the invention is characterized by the extreme simplicity of its circuit connections since a transistor, a transformer and a source of bias voltage are the only required circuit components.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4:
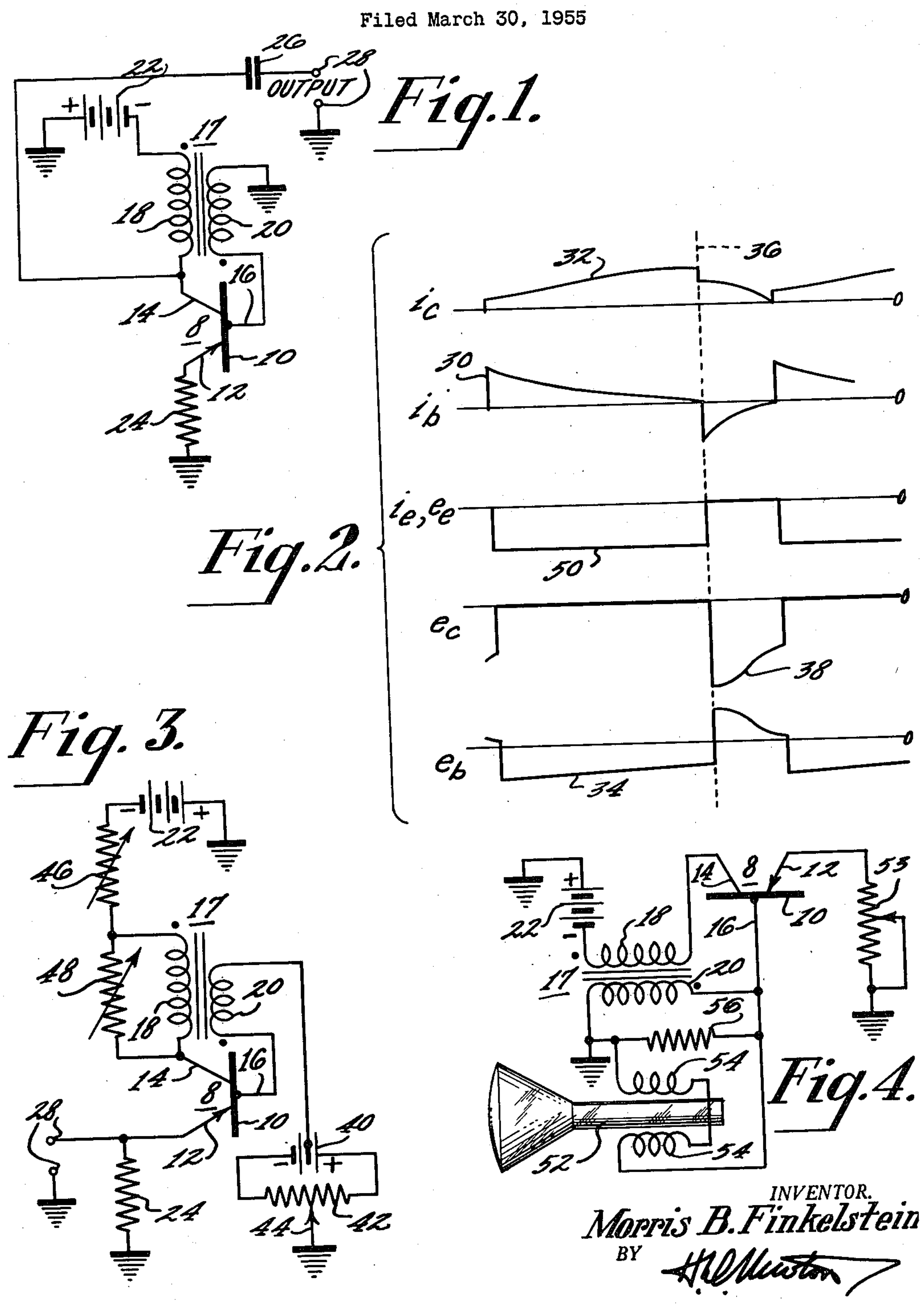
Figure 1 is a schematic circuit diagram of a transistor pulse generator or relaxation oscillator circuit embodying the invention.
Figure 2 is a graph showing related curves illustrating certain operating characteristics of the circuit of Figure 1, in accordance with the invention.
Figure 3 is a schematic circuit diagram of a square wave generator embodying the invention.
Figure 4 is a schematic circuit diagram of a sawtooth wave generator embodying the invention.

Referring now to the drawing, wherein like parts are indicated by like reference numerals throughout the figures, and referring in particular to Figure 1, a pulse generator or relaxation oscillator circuit in accordance with the invention includes a transistor 8 which may be considered to be a P–N–P junction transistor. The transistor, while preferably of the junction type, may alternatively be of any other suitable type having characteristics similar to those of a junction transistor. Moreover, the transistor 8 could be of P type conductivity, i. e., an N–P–N junction transistor, if the polarity of the biasing voltages were reversed. The transistor includes a semi-conductive body 10 with which an emitter 12, a collector 14 and a base 16 are cooperatively associated in a well known manner.

Regenerative or positive feedback for the circuit is provided by a feedback transformer 17 having a primary winding 18 and a secondary winding 20. The primary and secondary windings of the feedback transformer 17 are poled in opposite directions as shown and the secondary 20 preferably is constructed to be of fewer turns than the primary winding 18. Collector biasing voltages are supplied by a battery 22, the positive terminal of which is connected to a point of fixed reference potential or ground and the negative terminal of which is connected through the primary winding 18 to the collector 14 of the transistor 8. The secondary winding 20 of the feedback transformer 17 is serially connected between the base 16 and ground. The emitter 12 of the transistor 8 is connected through a resistor 24 having a relatively small resistance to ground or alternatively could be connected directly to ground. To provide an output circuit for the pulse generator, the lower or high voltage end of the primary winding 18 is coupled through a coupling capacitor 26 to one terminal 28 of a pair of output terminals, the other of which is grounded. Alternatively, the transformer 17 could be provided with a third winding from which output pulses could be derived or the output circuit could be connected with the emitter or base electrodes as shown in Figures 3 and 4 of the drawing.

In operation, assume initially that no biasing voltages have been applied to the circuit. Upon the application of collector biasing voltage to the circuit, the base current ($i_b$) increases rapidly as shown by the curve 30 in Figure 2 due to the regenerative feedback between the collector 14 and base 16 provided by the transformer 17. The transistor 8 at this point represents essentially a closed switch between its collector and emitter and the collector-to-emitter resistance is low. The collector current ($i_c$) is then a function of the inductance of the primary winding 18 and the resistance of the emitter resistor 24, the collector-to-emitter resistance of the transistor and whatever resistance the primary winding 18 has. The collector current therefore rises exponentially as shown by the curve 32 in Figure 2.

In the meantime, the base current has initially increased very rapidly. The maximum value of the base current is determined by the voltage which is developed across the secondary winding 20 of the feedback transformer 17. The base voltage ($e_b$) is determined by the inductance of the secondary winding and the rate of change of the collector current ($i_c$). The base voltage is shown by the curve 34 in Figure 2 and is essentially constant if the inductance of the primary winding 18 is large compared to the circuit resistance. The base current ($i_b$) then decreases until it again has control over the collector current ($i_c$) as shown by the dotted line 36 in Figure 2.

When the point 36 is reached in the circuit operation the collector current is at a maximum and the transistor is essentially in a current saturated state. At this point, the rate of collector current increase is suddenly decreased and the transistor is in a state of low current conduction. A large voltage pulse (approximately 80 volts) is thus produced at the collector as shown by the curve 38 in Figure 2. This voltage pulse may be taken from the output terminals 28 as shown.

The decrease in collector current is regeneratively coupled through the transformer 17 from the collector 14 to the base 16. The pulse of voltage thus produced in the base circuit, and as shown in Figure 2, is of such a polarity that it tends to cut the transistor off. For a transistor of N type conductivity the voltage pulse produced in the base circuit is of positive polarity as shown in Figure 2. The collector and base current then decay as shown by the curves 32 and 30 respectively in Figure 2. The transistor finally is no longer in a cut-off condition and the cycle described repeats.

While not shown, it should be understood that a pulse generator embodying the invention can be triggered or synchronized by the application of negative voltage pulses to the base or collector or by the application of positive pulses to the emitter for a transistor of N type conductivity. Moreover, the frequency of the pulses can be varied by varying the collector resistance at which saturation is attained, by varying the supply voltage or by varying the inductance of the primary winding 18.

As described, it is evident that a relaxation oscillator or pulse generator circuit embodying the invention is capable of producing useful voltage pulses of a relatively high voltage from a low voltage source. This result is achieved, moreover, with a circuit arrangement which is extremely simple in that a transistor, a transformer and a source of biasing voltage are the only essential circuit components.

In Figure 3, a square wave generator embodying the invention includes the transistor 8, the feedback transformer 17 and the biasing supply battery 22. An additional battery 48 is provided, the positive and negative terminals of which are connected to either end of a variable resistor 42 having a tap 44 which is connected directly to ground. An intermediate negative terminal of the battery 40 is connected through the secondary winding 20 to the base 16 of the transistor 8. By adjusting the resistance of the resistor 42 by means of the variable tap 44, the base bias is varied and thus a symmetry and fine frequency control of the output pulses is obtained.

The negative terminal of the biasing battery 22 is connected through a variable resistor 46 and the primary winding 18 of the feedback transformer 17 to the collector 14 of the transistor 8. By varying the resistance of the resistor 46, a tilt control of the output pulses may be obtained. A second variable resistor 48 is connected in parallel with the primary winding 18 and provides symmetry control to vary the width of the output pulses. As in Figure 1, the emitter 12 is connected to ground through the resistor 24. Output pulses are taken from across the emitter resistor 24. To this end, one of the output terminals 28 is grounded and the other output terminal 28 is connected to the junction of the emitter 12 and the emitter resistor 24.

In operation, the circuit illustrated in Figure 3 will be substantially identical to the operation of the circuit illustrated in Figure 1. A square wave voltage which is developed at the emitter and which is shown by the curve 50 in Figure 2 may be taken from the output terminals 28. Thus a circuit embodying the invention provides a means for generating low frequency square waves at a low impedance level. The symmetry of the square waves so developed may easily be controlled as may their frequency and tilt. As in Figure 1, the frequency may be controlled by several different methods but preferably by varying the inductance of the primary winding 18. Fine frequency control is provided by the variable base bias supply as described above.

In Figure 4, a sawtooth wave generator embodying the invention includes as in Figures 1 and 3 the transistor 8, the feedback transformer 17 and the supply battery 22. In addition, the emitter 12 of the transistor 8 is connected through a variable resistor 53 to ground. By varying the resistance of the resistor 53 the slope of the sawtooth wave may be varied.

A circuit of the type illustrated in Figure 4 may be used, for example, to provide the sawtooth deflection current for the kinescope of the television receiving system. To this end, a kinescope 52 is provided which has a vertical deflection yoke illustrated by an inductor 54 and a resistor 56 which are connected in parallel to each other and in parallel with the secondary winding 20 of the feedback transformer 17. In operation, the circuit illustrated in Figure 4 will be substantially identical to the circuit illustrated in Figure 1 and which has been described hereinbefore. A sawtooth wave of current is thus developed across the yoke of the kinescope 52 which may then be used for vertical deflection purposes.

As described herein, improved transistor relaxation oscillator or pulse generator circuits embodying the invention may provide useful voltage and current waves with a minimum number of circuit components. The circuits are reliable and efficient in operation and are capable of producing useful voltage pulses of relatively large magnitude from a low impedance-low voltage source. Moreover, the circuits embodying the invention are easily synchronized and the frequency tilt and symmetry of the output waveforms are easily controlled. Thus, circuits embodying the invention may be useful for many purposes as, for example, square wave generators or sawtooth wave generators for television receiving systems.

What is claimed is:

1. A pulse generator comprising, in combination, a transistor having base, emitter and collector electrodes, means including a transformer having a primary and a secondary winding connected for regenerative feedback between said collector and base electrodes to provide a stable state of low current conduction and a stable state of high current conduction for said transistor, the emitter current of said transistor being substantially constant during said stable state of high current conduction and zero during said stable state of low current conduction, said primary winding being connected with said collector electrode, direct-current conductive means connecting said secondary winding between said base electrode and a point of reference potential, means connecting said emitter electrode with said point of reference potential, and means providing biasing potentials for said transistor serially connected with said primary winding and said collector electrode.

2. A pulse generator as defined in claim 1, wherein the windings of said secondary winding exceed in number the windings of said primary winding and wherein said primary and secondary windings are poled in opposite directions.

3. In a square wave generator circuit, the combination with a transistor having base, emitter and collector electrodes, said transistor being of the junction type and having a current gain of less than unity as defined by the ratio of collector current increments to emitter current increments, of means providing a first state of high collector current conduction and constant emitter current conduction and a second state of low collector current conduction and substantially zero emitter current conduction for said transistor, said means including a transformer providing regenerative feedback between said collector and base electrodes and including a primary winding connected with said collector electrode and a secondary winding direct-current conductively connected between said base electrode and a point of reference potential in said circuit, means providing a source of biasing potential serially connected with said primary winding and said collector electrode, means including an impedance element connecting said emitter electrode with said point of reference potential, and output circuit means connected with said emitter electrode for deriving a square wave therefrom.

4. In a relaxation oscillator circuit, the combination with a transistor of the junction type having base, emitter and collector electrodes and a current gain of less than unity as defined by the ratio of collector current increments to emitter current increments, means providing regenerative feedback between said collector and base electrodes to provide a first state of high collector current conduction and constant emitter current conduction and a second state of low collector current conduction and substantially zero emitter current conduction for said transistor, said means including a feedback transformer having a primary and a secondary winding, means connecting said primary winding and a source of biasing potential in series with said collector electrode, and direct-current conductive means connecting said secondary winding between said base electrode and ground and in a polarity opposite to the connection of the primary winding with the collector electrode.

5. A vertical deflection sawtooth wave generator for a television receiving system comprising, in combination, a transistor having base, emitter and collector electrodes, means providing regenerative feedback between said collector and base electrodes to provide a stable state of low current conduction and a stable state of high current conduction for said transistor including a transformer having a primary and a secondary winding, the emitter current of said transistor being substantially constant during said stable state of high current conduction and zero during said stable state of low current conduction, means connecting said primary winding with said collector electrode, means serially connecting said secondary winding between said base electrode and a point of reference potential, means providing biasing potentials for said transistor serially connected with said primary winding and said collector electrode, and sawtooth wave output means for said generator including a deflection yoke connected in parallel with said secondary winding and with said base electrode.

6. A sawtooth wave generator as defined in claim 5, wherein a variable resistor is connected in series between said emitter electrode and said point of reference potential.

7. In a square wave generator circuit the combination with a junction transistor having base, emitter and collector electrodes, of means providing regenerative feedback between said collector and base electrodes to provide a stable state of low current conduction and a stable state of high current conduction for said transistor including a transformer having a primary and a secondary winding, the emitter current of said transistor being substantially constant during said stable state of high current conduction and zero during said stable state of low current conduction, means connecting said primary winding with said collector electrode, means connecting said secondary winding in series between said base electrode and a source of variable biasing potential, means providing a second source of biasing potential serially connected with said primary winding and said collector electrode, means including a resistor connecting said emitter electrode with said point of reference potential, and an output circuit connected with said emitter electrode for deriving a square wave therefrom.

8. A square wave generator as defined in claim 7, wherein a variable resistor is connected in shunt with said primary winding for providing symmetry control of said square wave.

9. A square wave generator as defined in claim 8, wherein a variable resistor is connected in series between said second source of biasing potential and said primary winding.

10. In a relaxation oscillator circuit, the combination with a junction transistor having base, emitter and collector electrodes and a current gain of less than unity as defined by the ratio of collector current increments to emitter current increments, of means providing a first state of high collector current conduction and constant emitter current conduction and a second state of low collector current conduction and substantially zero emitter current conduction for said transistor, said means including a feedback transformer providing regenerative feedback between said collector and base electrodes and having a primary and a secondary winding, means connecting said primary winding with said collector electrode, and direct-current conductive means connecting said secondary winding between said base electrode and a point of reference potential in said circuit.

References Cited in the file of this patent

UNITED STATES PATENTS

| | | |
|---|---|---|
| 2,745,012 | Felker | May 8, 1956 |

OTHER REFERENCES

Article: "Junction-Transistor Circuit Applications," by Sulzer, pages 170–173 of "Electronics" for August 1953.